United States Patent
Onuki et al.

(10) Patent No.: US 10,026,774 B2
(45) Date of Patent: Jul. 17, 2018

(54) METHOD OF MANUFACTURING SOLID-STATE IMAGE SENSOR AND SOLID-STATE IMAGE SENSOR

(71) Applicant: CANON KABUSHIKI KAISHA, Tokyo (JP)

(72) Inventors: Yusuke Onuki, Fujisawa (JP); Masatsugu Itahashi, Yokohama (JP); Nobuaki Kakinuma, Tokyo (JP); Mineo Shimotsusa, Machida (JP); Masato Fujita, Kitakyushu (JP); Takumi Ogino, Koganei (JP); Keita Torii, Yamato (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/722,681

(22) Filed: May 27, 2015

(65) Prior Publication Data

US 2015/0364517 A1  Dec. 17, 2015

(30) Foreign Application Priority Data

Jun. 13, 2014 (JP) .................................. 2014-122747

(51) Int. Cl.
*H01L 21/78* (2006.01)
*H01L 27/146* (2006.01)

(52) U.S. Cl.
CPC ........ *H01L 27/14689* (2013.01); *H01L 21/78* (2013.01); *H01L 27/14612* (2013.01);
(Continued)

(58) Field of Classification Search
CPC ......... H01L 27/14643; H01L 27/14612; H01L 27/1463; H01L 27/14632; H01L 27/14687;
(Continued)

(56) References Cited

U.S. PATENT DOCUMENTS 7,759,222 B2   7/2010  Morii et al.
7,920,192 B2   4/2011  Watanabe et al.
(Continued)

FOREIGN PATENT DOCUMENTS

CN   101752396 A   6/2010
CN   102254921 A   11/2011
(Continued)

OTHER PUBLICATIONS

Notification of Reasons for Refusal in Japanese Application No. 2014-122747 (dated Feb. 13, 2018).
(Continued)

*Primary Examiner* — Asok K Sarkar
*Assistant Examiner* — Dmitriy Yemelyanov
(74) *Attorney, Agent, or Firm* — Fitzpatrick, Cella, Harper & Scinto

(57) ABSTRACT

A method of manufacturing a solid-state image sensor including preparing a wafer including a pixel region where a photoelectric conversion element is provided, a peripheral circuit region where a gate electrode of a peripheral MOS transistor for constituting a peripheral circuit is provided, and a scribe region. The method includes forming an insulating film covering the pixel region, the peripheral circuit region, and the scribe region, and forming a sidewall spacer on a side surface of the gate electrode by etching the insulating film so that portions of the insulating film remains to cover the pixel region and the scribe region, and forming a metal silicide layer in the peripheral circuit region by using, as a mask for protection from silicidation, the insulating film covering the pixel region and the scribe region.

8 Claims, 5 Drawing Sheets

(52) U.S. Cl.
CPC .. *H01L 27/14632* (2013.01); *H01L 27/14636* (2013.01); *H01L 27/14641* (2013.01); *H01L 27/14687* (2013.01)

(58) Field of Classification Search
CPC ............... H01L 21/78; H01L 27/14636; H01L 27/14689; H01L 27/1462
USPC ........................................................ 257/292
See application file for complete search history.

(56) References Cited

U.S. PATENT DOCUMENTS

| | | | |
|---|---|---|---|
| 8,411,187 | B2 | 4/2013 | Watanabe et al. |
| 8,987,852 | B2 | 3/2015 | Okabe et al. |
| 9,018,073 | B2 | 4/2015 | Kawano et al. |
| 9,171,877 | B2 | 10/2015 | Hirano et al. |
| 9,373,658 | B2 | 6/2016 | Okabe et al. |
| 9,825,077 | B2 | 11/2017 | Watanabe et al. |
| 2007/0063317 | A1 | 3/2007 | Kim et al. |
| 2008/0087976 | A1* | 4/2008 | Morii .................. H01L 27/1462 257/446 |
| 2010/0173444 | A1* | 7/2010 | Mishima ........... H01L 27/14603 438/60 |
| 2010/0224766 | A1* | 9/2010 | Tateshita ........... H01L 21/82345 250/214.1 |
| 2011/0003426 | A1* | 1/2011 | Watanabe ......... H01L 27/14609 438/73 |
| 2011/0285892 | A1* | 11/2011 | Itahashi ................. G03B 17/00 348/308 |
| 2012/0002070 | A1* | 1/2012 | Akiyama .......... H01L 27/14614 348/222.1 |
| 2013/0089975 | A1* | 4/2013 | Onuki ............... H01L 21/28247 438/585 |
| 2016/0104736 | A1 | 4/2016 | Hirano et al. |

FOREIGN PATENT DOCUMENTS

| | | |
|---|---|---|
| CN | 102637708 A | 8/2012 |
| JP | 4-188832 | 7/1992 |
| JP | 4-188832 A | 7/1992 |
| JP | 2003-017557 A | 1/2003 |
| JP | 2008-041726 A | 2/2008 |
| JP | 2008-098373 A | 4/2008 |
| JP | 2011-243747 A | 12/2011 |
| JP | 2012-094718 A | 5/2012 |
| JP | 2013-222881 | 10/2013 |

OTHER PUBLICATIONS

First Office Action in Chinese Application No. 201510320636.9 (dated Sep. 29, 2017).
Second Office Action in Chinese Application No. 201510320636.9 (dated May 21, 2018).

* cited by examiner

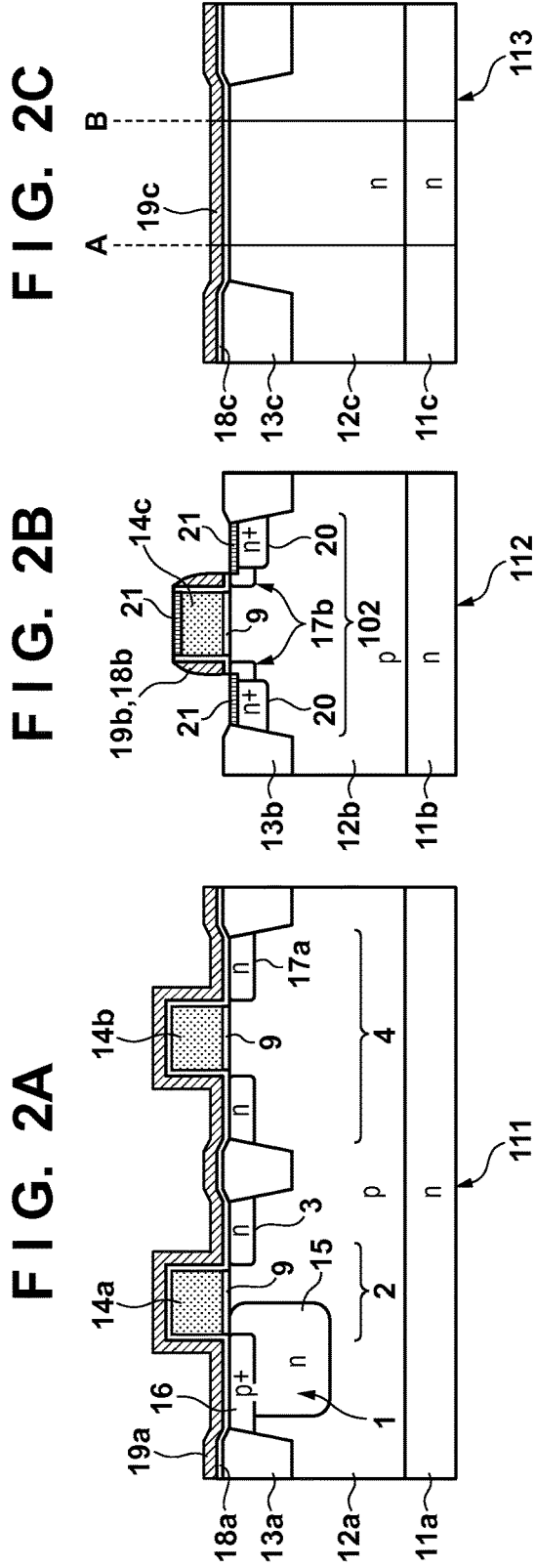

METHOD OF MANUFACTURING SOLID-STATE IMAGE SENSOR AND SOLID-STATE IMAGE SENSOR

BACKGROUND OF THE INVENTION

Field of the Invention

The present invention relates to a method of manufacturing a solid-state image sensor and a solid-state image sensor.

Description of the Related Art

Conventionally, a CCD image sensor, a CMOS image sensor, and the like are known as solid-state image sensors. The CMOS image sensor is superior to the CCD one in terms of power consumption and multi-functionality, and the application range of the CMOS image sensor is expanding recently. A chip used in the CMOS image sensor includes a pixel region including a light receiving portion (photodiode) that generates charges upon irradiation with light, and a peripheral circuit region where charges generated in the pixel region are read out as an electrical signal. The chip used in the image sensor is fabricated by performing dicing in a scribe region (scribe line) provided on a wafer.

In the pixel region, a plurality of pixels are formed. In the pixels, light receiving portions, and transistors for transferring charges generated in the light receiving portions to a peripheral circuit are formed. In the peripheral circuit region, transistors for processing a signal read out from the pixel are formed. Recently, the driving speed of solid-state image sensors is increasing. Along with this, the driving speed of the transistor in the peripheral circuit region also needs to be increased. To meet this request, there is proposed a technique of forming a metal silicide layer (metal semiconductor compound layer) from a compound of Si and a high melting point metal such as Ti or Co on the surface portions of respective regions serving as the gate electrode of the transistor and the electrodes of the source and drain regions.

A solid-state image sensor disclosed in Japanese Patent Laid-Open No. 2008-98373 pertains to a solid-state image sensor in which a silicide layer is formed on an electrode. In order to improve the flatness of the surface of the interlayer insulation film of the solid-state image sensor, the dummy of a gate electrode and the dummy of a protective insulation film are arranged in a scribe region, thereby reducing a global step.

A metal silicide layer is formed by causing silicon and a high melting point metal to react with each other on the surfaces of the source and drain regions. However, silicon and the high melting point metal do not completely react with each other, and the unreacted high melting point metal spreads in the semiconductor at a certain probability, causing metal contamination. This may cause characteristic degradation of the image sensor, such as a white defect. In the technique disclosed in Japanese Patent Laid-Open No. 2008-98373, silicon is exposed at most part of the scribe region. Considering that a general scribe region has a width of about 50 μm to 200 μm, a layer of a large amount of metal silicide is formed in the scribe region when forming a metal silicide layer. As a result, a large amount of unreacted high melting point metal is generated in the scribe region and spreads. Even if an insulating film covers the pixel region, the metal spreads in the insulating film and reaches the surface of a silicon wafer. This causes characteristic degradation of the image sensor, such as a white defect.

SUMMARY OF THE INVENTION

According to an aspect of the present invention, the present invention provides a method of manufacturing a solid-state image sensor including preparing a wafer including a pixel region where a photoelectric conversion element is provided, a peripheral circuit region where a gate electrode of a peripheral MOS transistor for constituting a peripheral circuit is provided, and a scribe region. The method includes forming an insulating film covering the pixel region, the peripheral circuit region, and the scribe region, and forming a sidewall spacer on a side surface of the gate electrode by etching the insulating film so that portions of the insulating film remains to cover the pixel region and the scribe region, and forming a metal silicide layer in the peripheral circuit region by using, as a mask for protection from silicidation, the insulating film covering the pixel region and the scribe region, wherein in the forming the metal silicide layer, an area of the insulating film covering the scribe region is not lower than 99% of an area of the scribe region.

Further features of the present invention will become apparent from the following description of exemplary embodiments (with reference to the attached drawings).

BRIEF DESCRIPTION OF THE DRAWINGS

FIGS. 2A to 2C are schematic sectional views showing the arrangement of the solid-state image sensor according to the embodiment of the present invention;

DESCRIPTION OF THE EMBODIMENTS

A chip constituting a solid-state image sensor according to an embodiment of the present invention includes a pixel region, and the pixel region typically includes a plurality of pixels arranged one- or two-dimensionally. Each pixel can include a photoelectric conversion element and MOS transistors. The MOS transistors included in the pixel can include a transfer MOS transistor that transfers charges generated in the photoelectric conversion element to a floating diffusion (floating diffusion layer). Each pixel can further include an amplification MOS transistor for amplifying a signal corresponding to charges that have been generated in the photoelectric conversion element and transferred to the floating diffusion. The amplification MOS transistor may be shared between a plurality of pixels. Each pixel can further include a reset MOS transistor that resets charges generated in the photoelectric conversion element and resets the potential of the floating diffusion. Each pixel can further include a selection MOS transistor for selecting output of a signal that corresponds to charges generated in the photoelectric conversion element and is output from the amplification MOS transistor. These MOS transistors included in the pixel will be generically called pixel MOS transistors. The solid-state image sensor can include a package that accommodates the chip, but the package can be omitted.

Figure 1A:
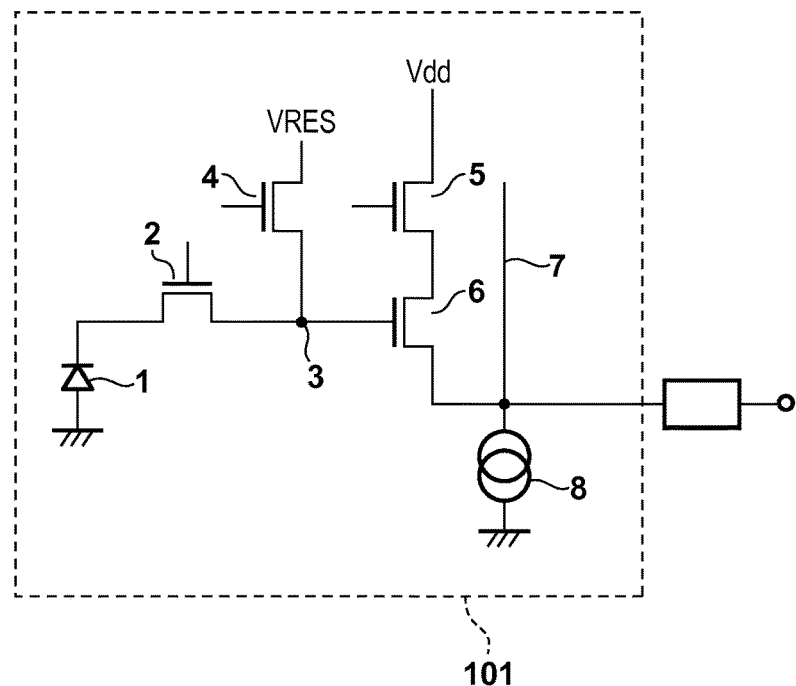
FIGS. 1A and 1B are views exemplifying the arrangement of a solid-state image sensor according to an embodiment of the present invention.

The arrangement of a pixel 101 in a photoelectric conversion device will be exemplarily explained with reference to FIG. 1A. The pixel 101 includes at least a photoelectric conversion element 1 that converts received light into charges, and a transfer MOS transistor 2 that transfers charges to a floating diffusion 3. The photoelectric conversion element 1 is, for example, a photodiode and converts incident light into charges. The charges generated in the photoelectric conversion element are transferred to the floating diffusion 3 to change the potential of the floating diffusion 3. In this example, the pixel 101 further includes a reset MOS transistor 4 that resets the potential of the floating diffusion 3 or the like, and an amplification MOS transistor 6. The gate electrode of the amplification MOS transistor 6 is electrically connected to the floating diffusion 3. The amplification MOS transistor 6 outputs, to a signal line 7, a signal corresponding to a potential change of the floating diffusion 3.

A power supply (power supply line) Vdd, the amplification MOS transistor 6, the signal line 7, and a constant current source 8 constitute a source follower circuit. A selection MOS transistor 5 is arranged between the power supply Vdd and the amplification MOS transistor 6 or between the amplification MOS transistor 6 and the signal line 7. When the selection MOS transistor 5 is turned on, the pixel 101 is selected, and the signal of the photoelectric conversion element 1 can be output to the signal line 7. The selection MOS transistor 5 may be omitted, and the reset MOS transistor 4 may control the reset potential of the floating diffusion to select a pixel.

Figure 1B:
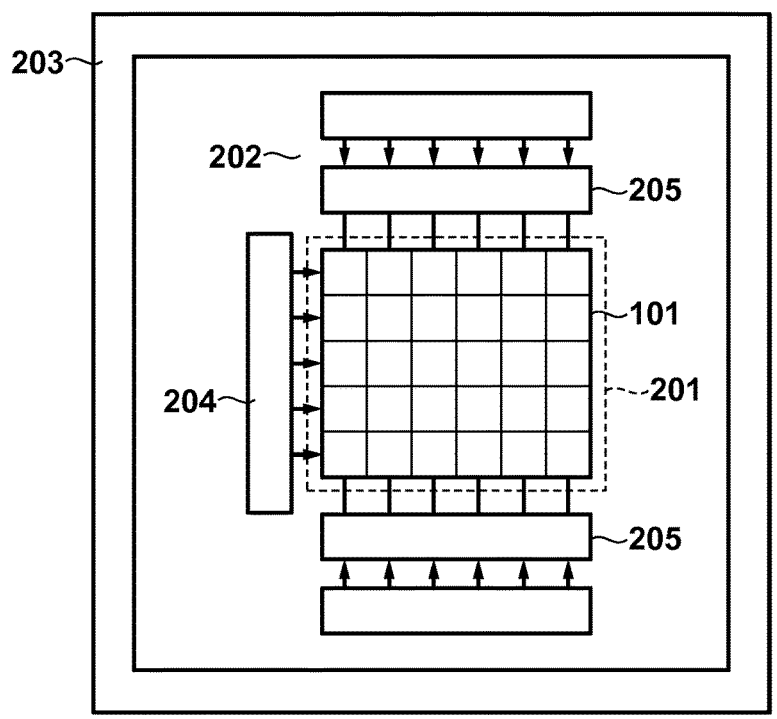

The arrangement of the photoelectric conversion device will be exemplarily explained with reference to FIG. 1B. The photoelectric conversion device includes a pixel region 201 including the pixels 101, a peripheral circuit region 202 positioned around the pixel region 201, and a scribe region 203 positioned around the peripheral circuit region 202. In the pixel region 201, the plurality of pixels 101 are arranged. The peripheral circuit region 202 includes MOS transistors that drive the pixels and process signals read out from the pixels. The peripheral circuit region 202 can include a scanning circuit 204 that generates a control signal for selecting the pixels 101 in the pixel region 201, and processing circuits (readout circuits) 205 that process signals output from the selected pixels 101. Further, when A/D conversion is performed in the photoelectric conversion device, the peripheral circuit region may include an A/D conversion circuit. MOS transistors for constituting these circuits (peripheral circuits) included in the peripheral circuit region will be generically called peripheral MOS transistors.

FIGS. 2A to 2C are sectional views showing the arrangement of the photoelectric conversion device according to this embodiment. FIG. 2A is a sectional view showing part of the pixel in a pixel region 111 corresponding to the pixel region 201 in FIG. 1B. FIG. 2B is a sectional view showing part of the peripheral circuit in a peripheral circuit region 112 corresponding to the peripheral circuit region 202 in FIG. 1B. FIG. 2C is a sectional view showing part of a scribe region 113 corresponding to the scribe region 203 in FIG. 1B. Elements are formed on wafers 11a, 11b, and 11c. In the scribe region 113, the wafer is diced and cut off. In FIG. 2C, A and B represent one end face A and the other end face B, out of two chips cut off in the scribe region, respectively. A portion having a width of about several ten μm to several hundred μm between the end faces A and B is cut and removed to expose an active region. Elements are isolated by element isolation portions 13a, 13b, and 13c. A method of separating elements is LOCOS, STI, mesa, or the like, and any method may be employed.

Next, the arrangement of the pixel region 111 will be explained with reference to FIG. 2A. A semiconductor region 15 of the first conductivity type constituting part of the photoelectric conversion element 1 is formed in a well 12a. The well 12a is a semiconductor region of the second conductivity type which is a conductivity type opposite to the first conductivity type. The first conductivity type is a conductivity type in which charges handled as a signal are used as majority carriers. In this embodiment, charges handled as a signal are electrons, so the first conductivity type is an n type. To the contrary, when charges handled as a signal are holes, the first conductivity type is a p type. A semiconductor region 16 is a semiconductor region of the second conductivity type for forming the semiconductor region 15 of the first conductivity type in the photoelectric conversion element 1 to have a buried structure. When light enters the semiconductor region 15, charges are generated. In this embodiment, electrons are generated in the semiconductor region 15.

The transfer MOS transistor 2 is provided adjacent to the photoelectric conversion element 1. The transfer MOS transistor 2 has a gate electrode 14a, and the ON/OFF state of the transfer MOS transistor 2 is controlled by a signal input to the gate electrode 14a. The transfer MOS transistor 2 controls transfer of charges generated in the photoelectric conversion element 1 to the floating diffusion 3. The floating diffusion 3 is connected to the reset MOS transistor 4, as shown in FIG. 1A. The potential of the floating diffusion or the like is reset by a signal input to a gate electrode 14b of the reset MOS transistor 4. A semiconductor region 17a of the first conductivity type receives a reset potential and functions as the drain of the reset MOS transistor 4. Note that a gate insulating layer 9 of the MOS transistor is formed below each of the gate electrodes 14a and 14b. Although FIG. 2A shows the reset MOS transistor 4 as a pixel MOS transistor other than the transfer MOS transistor 2, the amplification MOS transistor 6 and the selection MOS transistor 5 can also have the same structure as that of the reset MOS transistor 4. An insulating film serving as a multi-layer film obtained by laminating a plurality of insulating layers is formed on the surface of the pixel region 111. In this embodiment, a lower insulating layer of the insulating film is a silicon oxide layer 18a, and an upper insulating layer is a silicon nitride layer 19a. The insulating film is formed to cover at least a region where the photoelectric conversion element is formed. This multi-layer film functions as an antireflection film that reduces reflection of incident light on the surface of the photoelectric conversion element. In addition, this multi-layer film protects the pixel 101 from contamination by a metal when forming the electrode of a silicide layer in a peripheral MOS transistor 102 of the peripheral circuit region 112, for example, when forming an electrode using cobalt silicide. Further, this multi-layer film also functions as an etching stopper for obtaining an etching selectivity when forming by etching a contact hole for forming a contact plug.

FIG. 2B is a sectional view showing at least one MOS transistor out of a plurality of peripheral MOS transistors arranged in the peripheral circuit region 202 or 112. Here, the arrangement of the peripheral MOS transistor 102 of the first conductivity type (n type) is exemplified. A peripheral MOS transistor of the second conductivity type (p type) is also arranged in the peripheral circuit region 202 or 112. P- and n-type MOS transistors arranged in the peripheral circuit can form a CMOS circuit. The peripheral MOS transistor 102 includes a gate electrode 14c, and high-impurity-concentration semiconductor regions (diffusion regions) 20 of the first conductivity type each serving as a source or drain. The gate insulating layer 9 is formed below the gate electrode 14c. The peripheral MOS transistor 102 has an LDD structure, and low-impurity-concentration semiconductor regions 17b of the first conductivity type are arranged between the lower region of the gate electrode 14c and the semiconductor regions 20. The impurity concentration of the semiconductor region 17b is lower than that of the semiconductor region 20. A sidewall spacer is formed from an insulating film in contact with the side surface of the gate electrode 14c. In this embodiment, the insulating film constituting the sidewall spacer is an insulating film obtained by laminating a silicon oxide layer 18b and a silicon nitride layer 19b. In this embodiment, electrodes 21 are formed on the surfaces of the semiconductor regions 20 each serving as a source or drain and the surface of the gate electrode 14c in the peripheral circuit region 112. The electrode 21 is formed from a metal compound such as cobalt silicide.

Figure 3:
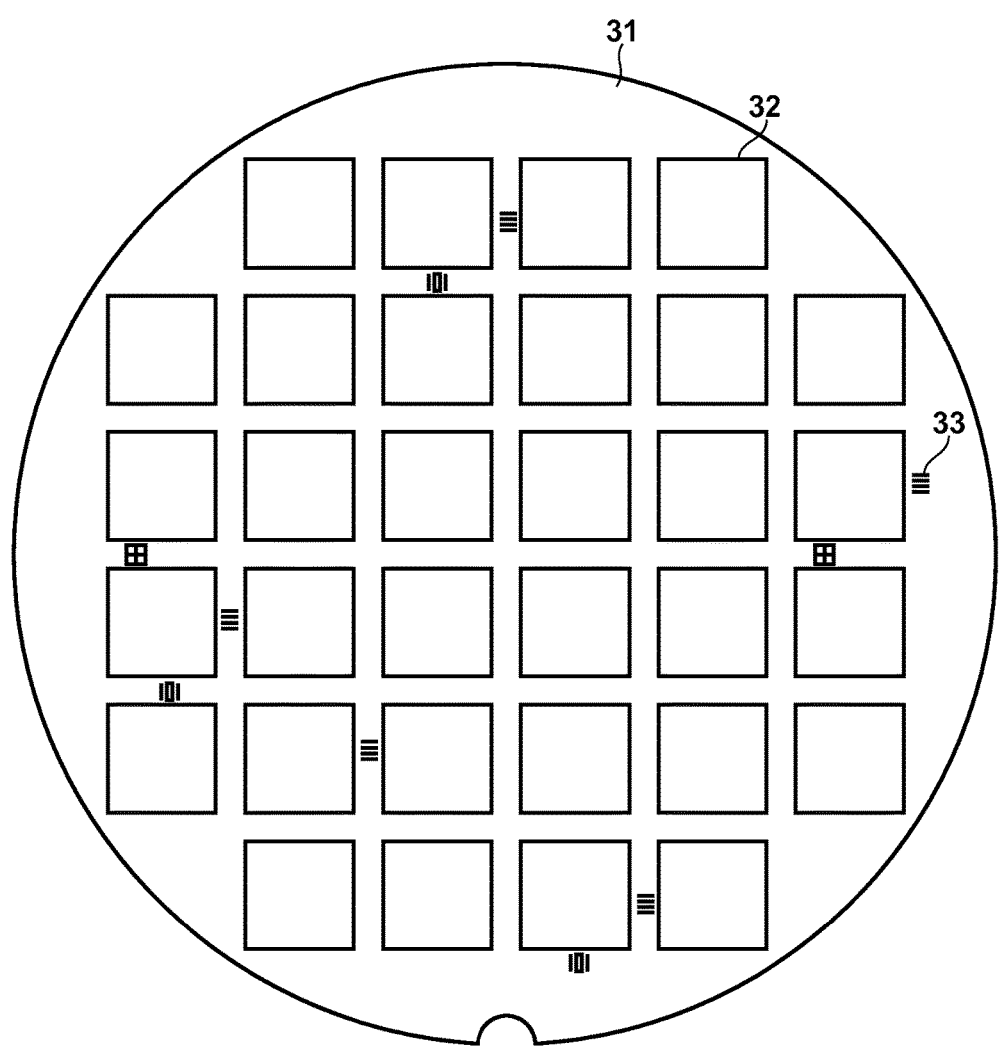
FIG. 3 is a view showing alignment marks on a wafer.

FIG. 2C shows the section of part of the wafer in the scribe region 113. The width of the scribe line is almost 50 μm to 200 μm. An insulating film obtained by laminating a silicon oxide layer 18c and a silicon nitride layer 19c is formed on the surface of the semiconductor region of the scribe region 113. The insulating film serving as the multi-layer film functions as a protective film for preventing formation of metal silicide such as cobalt silicide in the scribe region 203 or 113 when forming the electrode 21 from a metal silicide layer in the peripheral circuit region 112. In this embodiment, the insulating film serving as the protective film is a multi-layer film obtained by laminating the silicon oxide layer 18c and the silicon nitride layer 19c. As shown in FIG. 3, a plurality of chips 32 are formed on a wafer 31 before dicing. Accessories such as alignment marks 33 are formed in scribe regions between the chips. The portion at which accessories are formed may not be covered with the protective film. However, it is advantageous to widely cover the scribe region with the protective film in order to prevent formation of metal silicide. Thus, the occupation ratio of the area of the protective film in the scribe region 203 to the area of the scribe region 203 can be equal to or higher than 99%.

In this embodiment, the insulating film covering the pixel region 111, the insulating film constituting the sidewall spacer of the MOS transistor of the peripheral circuit region 112, and the insulating film covering the scribe region 113 are formed in the same step. For this reason, the materials of the insulating film constituting them are the same type. In this embodiment, the thicknesses of the silicon oxide layers 18a, 18b, and 18c forming the insulating films range from about 5 nm to 20 nm. The thicknesses of the silicon nitride layers 19a, 19b, and 19c range from about 10 nm to 100 nm. However, the material of the layer forming the insulating film and the thickness of the layer are not limited to this constitution. The thicknesses of the insulating films covering the pixel region 111 and the scribe region 113 are equal to each other because they are formed in the same step. Even if there is an error in the manufacturing step, the thickness of the insulating film covering the pixel region 111 falls within the range of 99% (inclusive) to 101% (inclusive) of the thickness of the insulating film covering the scribe region 113.

Next, a method of manufacturing the photoelectric conversion device will be explained with reference to the sectional views of FIGS. 4A to 4G showing the flow. Note that a well-known photoelectric conversion device manufacturing method can be used for manufacturing steps other than steps described in this embodiment.

Figure 4A:
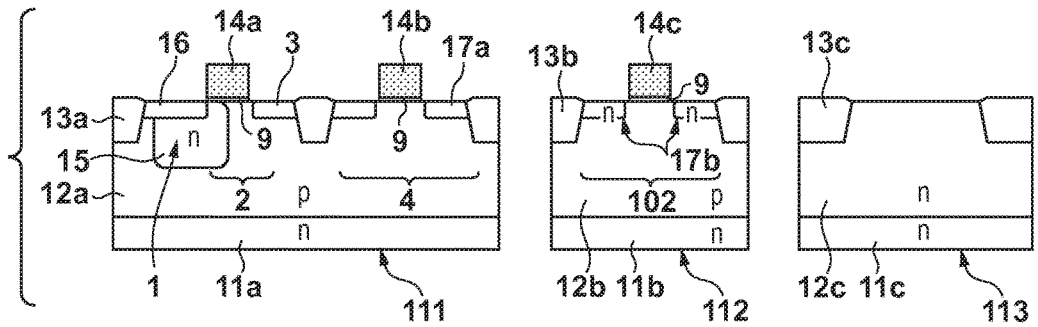
FIGS. 4A to 4G are schematic sectional views of a manufacturing process flow showing an example of the solid-state image sensor according to the embodiment of the present invention.

FIG. 4A shows a step of preparing a predetermined wafer. Respective regions formed in a wafer are not limited to this example, but are illustrated as shown in FIGS. 2A to 2C. On wafers 11a, 11b, and 11c made of silicon or the like, element isolation regions 13a, 13b, and 13c formed by STI, localized oxidation of silicon (LOCOS), or the like, and wells 12a and 12b of the second conductivity type (p type) are formed. Also, a semiconductor region 15 serving as part of the photoelectric conversion element 1 of the first conductivity type (n type) is formed. The gate electrode 14a of the transfer MOS transistor 2, the gate electrode 14b of the reset MOS transistor 4, and the gate electrode 14c of the peripheral MOS transistor 102 of the peripheral circuit region 112 are also formed. To form the photoelectric conversion element 1 into a buried structure, a semiconductor region 16 of the second conductivity type is formed on the surface of the wafer, and a floating diffusion 3 is also formed. In the MOS transistor of the pixel region 111, a low-impurity-concentration semiconductor region 17a of the first conductivity type (n type) with a single drain structure is formed in the MOS transistor of the pixel region 111. Low-impurity-concentration semiconductor regions 17b of the first conductivity type (n type) with the LDD structure are formed in the peripheral MOS transistor 102 of the peripheral circuit region. When the wafer is of an n type, as represented by the section of the scribe region 113, a well 12c in the scribe region 113 can have the same polarity and is of an n type.

Figure 4B:
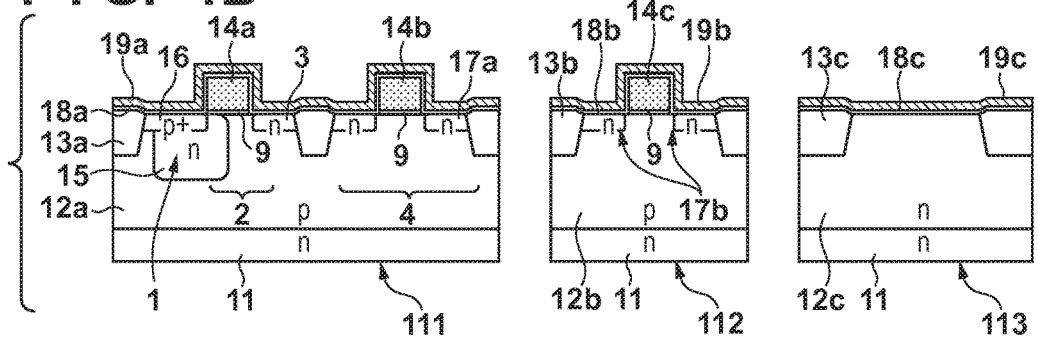

Then, as shown in FIG. 4B, insulating films obtained by laminating silicon oxide layers 18a, 18b, and 18c and silicon nitride layers 19a, 19b, and 19c are so formed as to cover the surface of a wafer 11 including the upper surfaces of gate electrodes. The materials of the layers constituting the insulating film formed at this time are not limited to the silicon oxide layer and the silicon nitride layer. In order to adjust the width of the sidewall spacer to be formed on the side surface of the gate electrode 14c of the peripheral MOS transistor 102 of the peripheral circuit region 112, a multi-layer film obtained by depositing a silicon oxide layer may also be formed immediately on the silicon nitride layers 19a, 19b, and 19c.

Figure 4C:
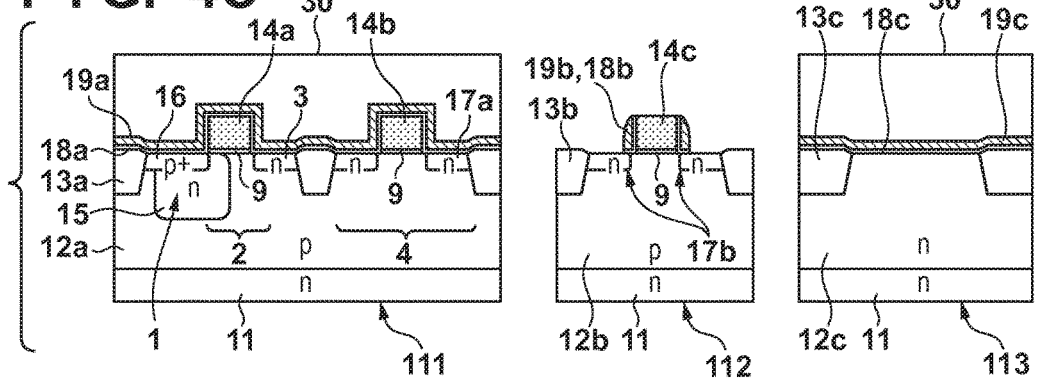

As shown in FIG. 4C, the pixel region 111 and the scribe region 113 are masked by a resist 30. In this state, the insulating film obtained by laminating the silicon oxide layer 18b and the silicon nitride layer 19b is etched back. As a result, a sidewall spacer constituted by at least part of the silicon oxide layer 18b and the silicon nitride layer 19b is formed on the side surface of the gate electrode 14c of the peripheral MOS transistor 102 of the peripheral circuit region 112. At this time, the insulating film made of the silicon oxide layer 18a and the silicon nitride layer 19a remains in the pixel region 111. The insulating film functions as antireflection of incident light, protection when a high melting point metal reacts, and an etching stopper at the time of forming a contact plug. In the scribe region 113, the insulating film obtained by laminating the silicon oxide layer 18c and the silicon nitride layer 19c remains. This insulating film protects the scribe region when a high melting point metal reacts. Although not shown, a high-resistance diffused resistor element can also be formed while the film obtained by laminating the silicon oxide layer 18b and the silicon nitride layer 19b remains in the peripheral circuit region. When forming the sidewall spacer, an alignment mark 33 can be formed by removing part of the insulating film covering the scribe line region 113. The alignment mark 33 can be silicided in a subsequent step.

Figure 4D:
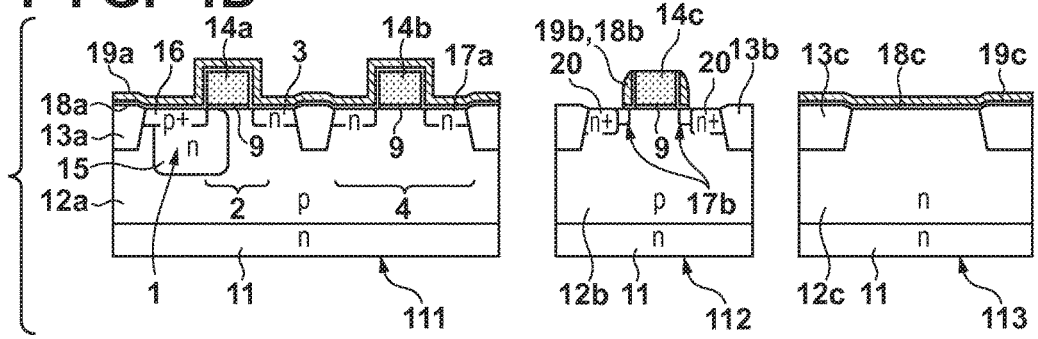

Thereafter, as shown in FIG. 4D, an impurity of the first conductivity type (n type) is introduced using, as an ion implantation mask, the gate electrode 14c of the peripheral MOS transistor 102 of the peripheral circuit region 112 and the sidewall spacer (formed from the silicon oxide layer 18b and the silicon nitride layer 19b). As a result, high-impurity-concentration semiconductor regions 20 self-aligned to the sidewall spacer are formed. Each semiconductor region 20 serves as the source or drain of the MOS transistor. This flow explains the manufacturing method by exemplifying the n-type peripheral MOS transistor 102 of the peripheral circuit region 112. In general, however, even a p-type MOS transistor simultaneously exists in the peripheral circuit region 202 or 112. When forming a p-type MOS transistor, p-type high-concentration impurity layers are implanted into semiconductor regions serving as a source and drain. Then, an annealing step is executed to activate the high-concentration impurity layers of the source and drain regions.

Figure 4E:
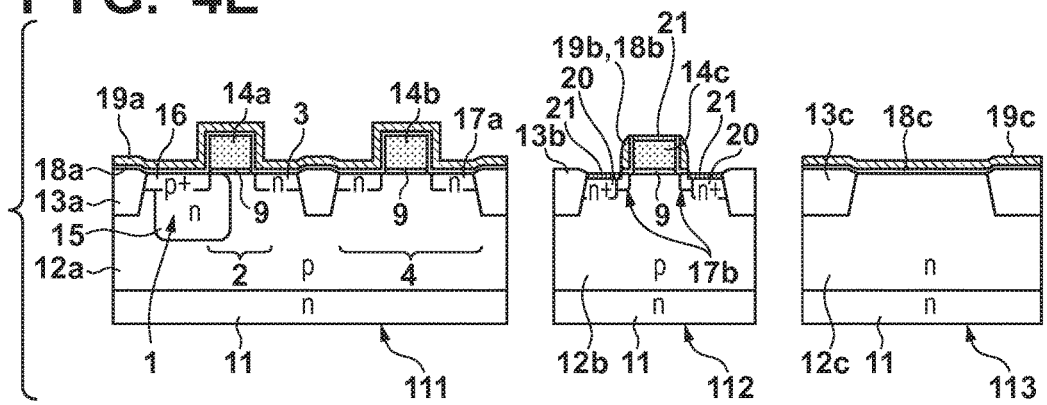

Then, as shown in FIG. 4E, the insulating films obtained by laminating the silicon oxide layers 18a and 18c and the silicon nitride layers 19a and 19c are used as a mask for protecting the pixel region and the scribe region from silicidation, thereby siliciding the electrodes. A metal silicide layer is formed by causing silicon and a high melting point metal to react with each other on the surfaces of the source and drain regions of the peripheral MOS transistor 102 of the peripheral circuit region 112 and the surfaces of the gate electrodes. As a result, a silicide electrode 21 is formed in the peripheral MOS transistor 102 of the peripheral circuit region 112. In contrast, since the occupation ratio of the area of the protective film in the scribe region 203 to the area of the scribe region 203 can be equal to or higher than 99%, the pixel region 111 and the scribe region 113 are protected by the insulating film, so formation of metal silicide is suppressed in these regions.

Figure 4F:
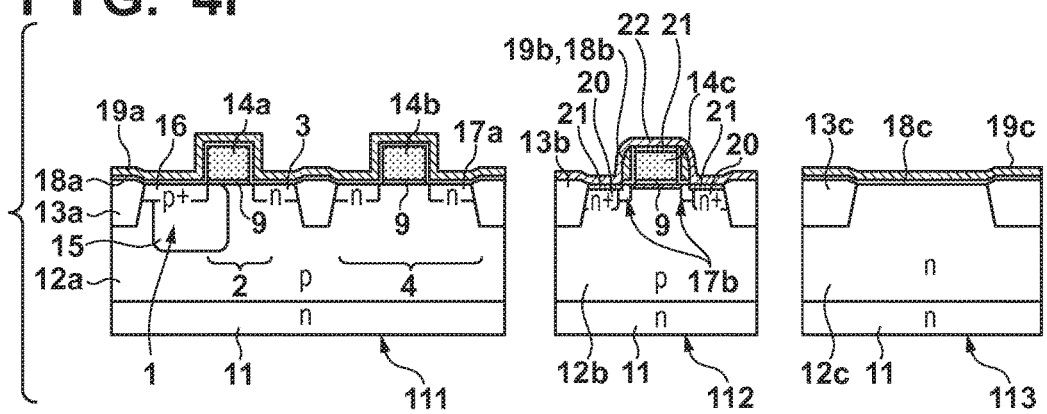
Figure 4G:
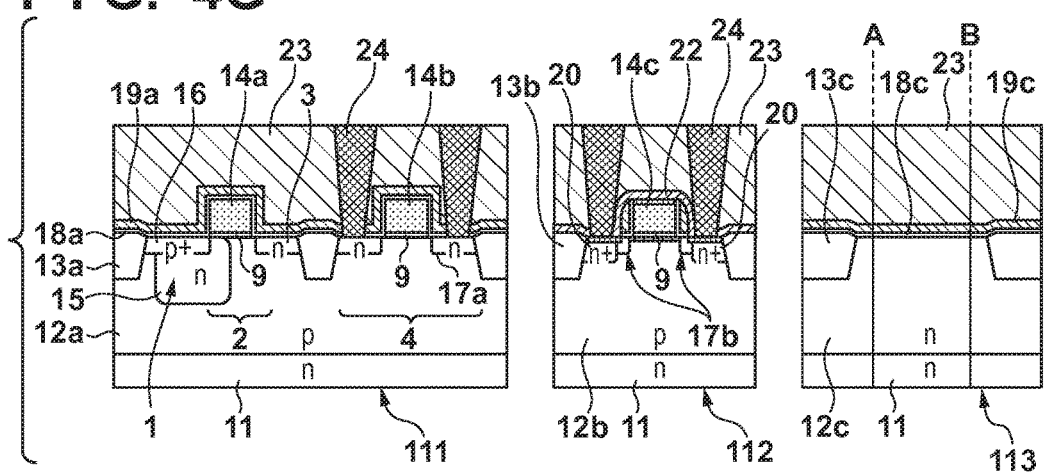

Subsequently, as shown in FIG. 4F, a silicon nitride layer 22 is formed to cover the peripheral MOS transistor 102 of the peripheral circuit region 112. The silicon nitride layer 22 functions as an etching stopper when forming a contact hole by etching. As shown in FIG. 4G, after an interlayer insulation film 23 is formed, contact holes are formed and contact plugs 24 are formed. Then, the wafer is diced in the scribe region, thereby fabricating chips. To suppress characteristic degradation, it is possible to dice the wafer so that metal silicide is not exposed on the end face of the chip serving as the cut edge of the wafer. FIG. 4G shows portions serving as end face A of one chip and end face B of the other chip, out of two chips by dicing. A portion of the wafer that has a width of about several ten μm to several hundred μm between end face A and end face B is cut by a dicing blade and removed. Since silicidation is suppressed in the scribe region 113, degradation of the solid-state image sensor is suppressed even if the active region appears on the end face of the chip after dicing.

According to this embodiment, at the time of metal silicidation of the electrode of the MOS transistor of the peripheral circuit region, formation of unwanted metal silicide in the scribe region can be avoided. Further, an insulating film that protects the scribe region can be formed without increasing the number of steps. As a result, metal contamination caused by spread, into the pixel region, of an unreacted high melting point metal that may cause characteristic degradation of an image sensor, such as a white defect, can be suppressed. Generation of a defect in the solid-state image sensor can therefore be suppressed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-122747, filed Jun. 13, 2014, which is hereby incorporated by reference herein in its entirety.

What is claimed is:

1. A solid-state image sensor comprising a pixel region which is arranged in a chip, and includes a plurality of pixels each including a photoelectric conversion element, and a peripheral circuit region which is arranged between the pixel region and an end face of the chip, and includes a MOS transistor,
   wherein the MOS transistor includes a metal silicide layer,
   wherein a sidewall spacer is formed from a third part of an insulating film and is disposed on a side surface of a gate electrode of the MOS transistor,
   wherein the photoelectric conversion element is covered with a first part of the insulating film formed from the same material as a material of the sidewall spacer,
   wherein a second part of the insulating film, which is formed from the same material as the material of the sidewall spacer, forms a part of the end face of the chip,
   wherein the second part of the insulating film does not cover the sidewall spacer, is spaced apart from the sidewall spacer and from the first part of the insulating film, and does not overlap with the first part of the insulating film,
   wherein a silicon nitride layer is arranged such that the silicon nitride layer includes a portion that is arranged between an interlayer insulation film and the sidewall spacer, the silicon nitride layer includes a portion that is arranged between the interlayer insulation film and the metal silicide layer, and the silicon nitride layer does not extend to the end face of the chip, and
   wherein a thickness of the second part of the insulating film is from 99% to 101% of a thickness of the first part of the insulating film.

2. The sensor according to claim 1, wherein a metal silicide does not form the end face of the chip.

3. The sensor according to claim 1, wherein the first part of the insulating film in the pixel region is a multi-layer film including a silicon oxide layer and a silicon nitride layer.

4. The sensor according to claim 1, wherein the first part of the insulating film in the pixel region contacts a contact plug connected to a MOS transistor in the pixel region.

5. The sensor according to claim 3, wherein the multi-layer film functions as an antireflection film configured to reduce reflection of incident light on a surface of the photoelectric conversion element.

6. The sensor according to claim 1, wherein an element isolation region does not form the end face of the chip.

7. The sensor according to claim 1, wherein the first part of the insulating film covers a reset MOS transistor in the pixel region.

8. The sensor according to claim 1, further comprising a contact plug on the metal silicide layer arranged through the interlayer insulation film and the silicon nitride layer.

* * * * *